United States Patent
Vaman et al.

[11] Patent Number: 5,993,056
[45] Date of Patent: Nov. 30, 1999

[54] HIGH INTEGRITY TRANSPORT FOR TIME CRITICAL MULTIMEDIA NETWORKING APPLICATIONS

[75] Inventors: Dhadesugoor R. Vaman, Frederick, Md.; Cadathur V. Chakravarthy, Mapplewood, N.J.; Kicheon Hong, Seoul, Rep. of Korea

[73] Assignee: Stevens Institute of Technology, Hoboken, N.J.

[21] Appl. No.: 08/901,825

[22] Filed: Jul. 28, 1997

Related U.S. Application Data

[63] Continuation of application No. 08/429,942, Apr. 27, 1995, abandoned.

[51] Int. Cl.$^6$ .................................................... H03M 13/00
[52] U.S. Cl. ........................................ 371/37.02; 371/37.4
[58] Field of Search ................................. 371/37.4, 37.02

[56] References Cited

U.S. PATENT DOCUMENTS 5,159,452  10/1992  Kinoshita et al. ....................... 358/141
5,432,787  7/1995  Chethik ..................................... 370/79

OTHER PUBLICATIONS

Dravida, S., et al., "Error Detection and Correction Options for Data Services in B–ISDN", IEEE Journal on Selected Areas in Communications, vol. 9, No. 9, pp. 1484–1495, Dec. 1991.

Ohta, H. et al., "A Cell Loss Recovery Method using FEC in ATM Networks", IEEE Journal on Selected Areas in Communications, vol. 9, No. 9, pp. 1471–1482, Dec. 1991.

Ohta, H. et al., "A Technique to Detect and Compensate Consecutive Cell Loss in ATM Networks", INFOCOM '91, pp. 781–790, Dec. 1991.

Anand, K., et al., "FEC and Priority for VBR Video Distribution over ATM", Electrical and Compter Engineering, 1993, Canadian Conference, pp. 550–553, Mar. 1993.

Kinoshita, T. et al, "Variable–Bit–Rate HDTV CODEC with ATM–Cell–Loss Compensation", IEEE Transactions on Circuits and Systems for Video Technology, vol. 3, No. 3, pp. 230–237, Jun. 1993.

Kalathur et al., "Forward Error Correction with Buffer Management in Multimedia ATM Networks", SOUTHCON '94, pp. 437–444, Dec. 1994.

Gallager, R.G. and Bestsekas, D., "Single Parity Checks", *Data Communications,* Prentice Hall 1984, pp. 58–59.

Schakum, N. and McKenney, P., "Packet Recovery in High- -Speed Networks Using Coding and Buffer Management", Information and Telecommunications Sciences Center SRI International, Menlo Park, CA, 1990.

*Primary Examiner*—Stephen M. Baker
*Attorney, Agent, or Firm*—Friscia & Nussbaum

[57] ABSTRACT

A method is provided for recovery of lost cells in an ATM network wherein an error recovery scheme is incorporated into the ATM adaptation layer to allow recovery of cells along the network.

13 Claims, 1 Drawing Sheet

HIGH INTEGRITY TRANSPORT FOR TIME CRITICAL MULTIMEDIA NETWORKING APPLICATIONS

This application is a continuation application of application Ser. No. 08/429,942, filed Apr. 27, 1995, now abandoned.

INTRODUCTION

This invention was made in the course of research sponsored by the Department of the Navy, Contract No: N 00140-94-C-BC 03. The U.S. Government may have certain rights in this invention.

BACKGROUND OF THE INVENTION

A major concern in any communication network is the control of transmission errors. Redundancy is the basis of error control. Automatic Repeat Request (ARQ) schemes are often preferred to Forward Error Correction (FEC) schemes because they are easy to implement and show superior performance at low bit-error rates. The throughput rate of an ARQ scheme strongly depends on the number of requested retransmissions and this falls rapidly with increasing bit error rate (BER). For applications involving real-time video and voice over very high speed networks, ARQ-based schemes impose an unacceptably long transmission delay. The problem is more acute if the data paths are fairly long, as in wide area networks (WANs). On the other hand, since FEC has no retransmissions, the throughput rate of FEC schemes is more or less constant, set by the code rate and to a large extent, independent of the channel error probability. Recovering lost data reduces the need for data retransmissions and enhances the quality of real-time application (video and voice) that cannot rely on acknowledgments (ACKs) and retransmissions because of the large delays involved.

High speed networks, such as Asynchronous Transfer Mode (ATM) and other WANs, are based on the fiber-optic links with very low bit error rates, typically from $10^{-10}$ to $10^{-14}$, over long distance fiber cable. The main cause of data loss in these networks is buffer overflow during congestion, rather than bit errors. In ATM networks, low priority cells are dropped first in the event of congestion. Since a lost cell is just a block of bits in error, essentially some form of FEC is needed.

At present, apart from the techniques of error concealment, there is only the recommendation of the International Telecommunications Union (ITU-T) for error recovery in ATM transmission. ITU-T recommendation I.363 'B-ISDN ATM Adaptation Layer Specification' Rev 1 Geneva 1993. This technique uses either a (128,124) Reed-Solomon (R-S) Forward Error Correction (FEC) method with interleaving or a (94,88) R-S code with interleaving. The first method recovers lost cells in a group of 128 with a 3.1% overhead, while the second can recover 1 lost cell in a group of 16 with a 6.8% overhead. These techniques are specifically for end-end recovery.

SUMMARY OF THE INVENTION

Most high speed networks use or will be using the Asynchronous Transfer Mode (ATM) technique. In this technique, all digital data are segmented into groups of 44 bytes. Each of these segments has 2 bytes each, appended before and after, resulting in a 48 octet payload. The data link protocol adds an additional 5 byte header containing the routing information to form the final ATM cell. While the links are relatively error free, there is always potential for cells to be dropped by the network due to congestion. This may occur at switches or elsewhere.

In the present invention, a method is provided for recovering lost cells whereby the ATM adaptation layer is capable of selectively implementing an error recovery scheme if required. In this method, the ATM layer may either insert or delete the recovered cells, depending upon the data being transmitted. For example, if voice data is being transmitted, one may choose not to insert the cells since occasional lost cells do not cause significant loss of quality. However, for more sensitive data such as video data, the ATM layer can insert the recovered cells. The present invention also allows for the recovery of lost cells along the network itself without having to wait until the cells reach their destination.

DETAILED DESCRIPTION OF THE INVENTION

In the present invention, a method for recovering lost cells in an ATM network is provided wherein the ATM adaptation layer is capable of selectively implementing an error recovery scheme. The method uses a set of parity data that is determined based upon user data. User data as well as parity data is formed into ATM cells of appropriate size. Whenever one or more of these cells becomes lost, the ATM adaptation layer can selectively implement the error recovery scheme to recover lost data. In addition, a technique for identifying errors in the cell can be incorporated for use in correction of a cell that is received but with errors. With this technique, a cell with errors can be identified, discarded and recovered with the correct information as though it had been lost. Error identifying techniques are well known to those of skill in the art.

In accordance with the method of the invention, data packets are grouped into blocks of predetermined size. Parity packets that contain the error-control bits are then added to each block. The number of parity packets and their construction determines the maximum number of data packets that can be recovered. One packet can be recovered from a block protected by a single vertical parity packet. To recover more packets in a block, more control data must be added. To create a block with two-packet recovery capability, a vertical and diagonal parity must be added to each block. The number of lost packets recovered and the marginal increase in a data rate must be considered in making the determination of the number of parity packets and their construction.

As an example, the transmission of image data over ATM networks using a method like subband coding has now been performed. The division of images into subbands is accomplished by the use of a single stage of lowpass/highpass operation in each direction resulting in a total of four subbands. That is, the 512×512-pixel image is divided into 4 subbands in 2 dimensions each with a size of 256×256.

After the subbands are encoded by using the Adaptive Delta Modulation (ADM), they are packetized for the use in an ATM network. Since an ATM cell contains 53 octets, with 48 of these being data, the frame (256×256) is broken into the appropriate number of 48 octet units for transmission.

The encoded data is packetized into ATM cells of 48 octets for transmission. Appropriate parity bits are computed and these are also grouped into ATM cells for transmission. In order to recover a single packet, a vertical parity cell must be added to each block of k cells. The vertical parity packet $P_{pi}$ is generated by the following rule:

$$P_{p_i} = \left(\sum_{j=1}^{K} d_{ji}\right) mod(2), i = 1, 2, \ldots, m$$

where $d_{ji}$ is the i-th bit of the j-th packet and $P_{pi}$ is the sum modulo 2 of the bits in the i-th column.

Figure 1:
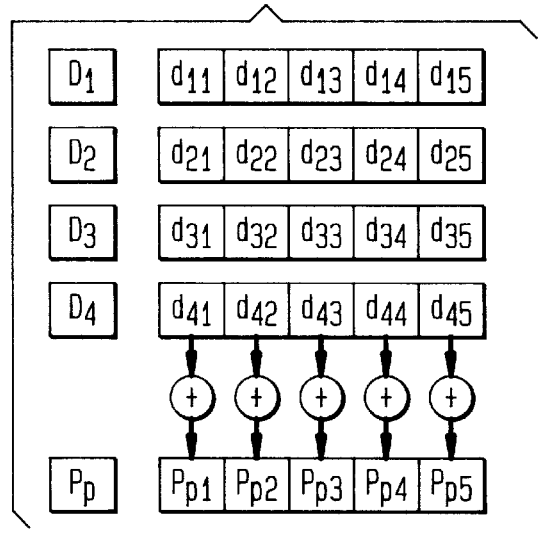
FIG. 1 provides a schematic showing the formation of vertical parity which is used in the method of recovery of one lost packet.

The method of recovering one lost packet is shown in FIG. 1. If the vertical parity is formed as the bit by bit $\oplus$ in each position, the vertical parity packet ($P_p$) can be determined as $P_p = D_1 \oplus D_2 \oplus D_3 \oplus D_4$ such that $P_{pj} = d_{1j} \oplus d_{2j} \oplus d_{3j} \oplus d_{4j}$ j=1,2, . . . 5 Therefore, if packet $D_3$ is missing from a block, it can be recovered as:

$D_3 = P_p \oplus D_1 \oplus D_2 \oplus D_4$

Figure 2:
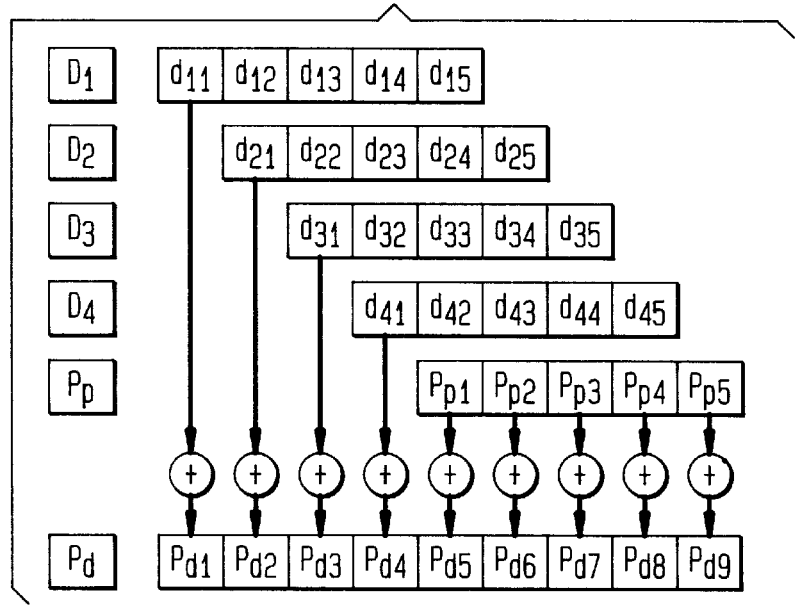
FIG. 2 provides a schematic showing the formation of diagonal parity which is used in the method of recovery of more than one lost packet.

When a block protected by a single vertical parity packet is received with two or more packets missing, none of those packets can be recovered. In addition to the vertical parity, diagonal parity is formed as shown in FIG. 2. To recover two packets in a block, a diagonal parity packet (the bits of which are the modulo-2 sums of bits along block diagonals) is also formed. The diagonal parity packet has m+K bits, compared to m bits in a data or vertical parity packet. One vertical parity cell with m bits and the diagonal cell with m+K bits are used by the receiver to recover two missing cells.

The diagonal packet $P_d$ in this case contains 9 elements as shown in FIG. 2. The diagonal parities are determined as follows:

$P_{d1} = d_{11}$, $P_{d2} = d_{12} \oplus d_{21}$ $P_{d3} = d_{13} \oplus d_{22} \oplus d_{31}$ etc.

The error recovery scheme used in the present invention is similar to the horizontal and vertical parity checks described by Gallager, R. G. and Bestsekas, D., *Data Communications*, Prentice Hall 1984, p 58–59 and the packet recovery method described by Schakum, N. and McKenney, P., Information and Telecommunications Sciences Center SRI International, Menlo Park, Calif., 1990. However, in the present invention, this error recovery system is incorporated into the ATM adaptation layer so that error recovery can be performed along the ATM network. The method is suitable for any type of ATM adaptation layer including, but not limited to, AAL1 and AAL2. It is applicable either on an end-end basis or on a node to node basis.

Figure 3:
FIG. 3 is a schematic diagram of an ATM network having three nodes.

FIG. 3. shows an ATM network where error recovery can be performed on a node to node basis along the ATM network.

In the following example, two missing packets are recovered. Packets 1 and 4 along with the vertical and diagonal parities are received and packets 2 and 3 are missing. The receiver reconstructs the two missing packets in a block by forming new parity packets based on the data received as follows. The new vertical and diagonal parities, $P_{pr}$ and $P_{dr}$, are formed. By forming the modulo 2 sum of the received vertical parity $P_p$, the new parity $P_{pr}$, as well as the modulo 2 sum of the received diagonal parities $P_d$ and the new parity $P_{dr}$, syndromes $S_p$ and $S_d$ are generated. The missing data is recovered as follows:

$d_{21} = d_{12} \oplus P_{d2}$, $d_{31} = d_{21} \oplus S_{p1}$ $d_{22} = d_{31} \oplus S_{d3}$, $d_{32} = d_{22} \oplus S_{p2}$ $d_{23} = d_{32} \oplus S_{d4}$, $d_{33} = d_{23} \oplus S_{p3}$ $d_{24} = d_{33} \oplus S_{d5}$, $d_{34} = d_{24} \oplus S_{p4}$ $d_{25} = d_{34} \oplus S_{d6}$, $d_{35} = d_{25} \oplus S_{p5}$ The recovery of any pair of missing packets can be done in a similar fashion. By using the vertical and diagonal parities, a maximum of two packets in a block can be recovered.

To increase the packet recovering capability, parity packets are added which are linearly independent of the previously constructed parity packets. It is necessary to consider the number of lost packets recovered and the increase in the data rate as part of the process.

The present invention can be used in the general framework of ATM transmission. The present invention can also be applied to other modes of packetized transmission. In one embodiment, the user can segment the data into 44 octet blocks, form the parity and then send these to the ATM adaptation layer. The ATM adaptation layer will then form the cells and transmit them. In this embodiment, any error recovery is end to end only. Alternatively, in another embodiment, the ATM adaptation layer can introduce this facility. That is, the adaptation layer will form the 44 octet blocks, add the 2 bytes before and after the data block, and finally add the 5 byte header to complete the cell. The advantage of this embodiment is that error recovery can be across links so that error accumulation is avoided. By suitably modifying error recovery, the facility of either including the error recovery scheme or inhibiting it can be added.

The present invention can be used in a wireless environment for recovering missing data without having to request retransmission. The present invention can also be used in digital speech interpolation systems, as a means of either improving the speech quality or as a means of accommodating more users without increasing the bandwidth if quality improvement is not required. The method of the invention can be included in a software application or VLSI chip form for ATM networks.

The invention is further illustrated by the following non-limiting examples.

EXAMPLES

Example 1

A 4 band sub-band encoder for video using a 2-D Adaptive Delta Modulation (ADM) encoder as the main digitizer performs as follows. The picture signal is split into four sub-bands using conventional separable 2-D filters. The four bands obtained are LL, LH, HL and the HH. The first three sub-bands contain significant correlation in one or both spatial directions. An ADM (one bit/pixel) is used for encoding these signals after decimation by a factor of 2, while the HH band with little or no correlation in either direction, is encoded using a conventional Pulse Code Modulation (PCM) encoder with 2 bits/pixel. Hence, the average number of bits/pixel is 1.25. Further reduction of up to 0.5 bits/pixel is possible with straightforward data compression methods which are well known in the art.

The predictor used for the ADM is a 2-D predictor that uses correlation data in the horizontal, vertical and the two diagonal directions. Correlation data has been measured for a number of standard pictures such as LENA, KEIL, etc. and averaged for the use in the encoder. With pictures having predominately low frequency content, the reproduced picture quality is excellent. However, with a picture having a large amount of high frequency content the quality is not as good, however it is better than that obtained using other techniques such as Adaptive Block Truncation Coding.

Example 2

The method can be used to transmit data over a lossy high speed network such as an ATM network. To transmit data over an ATM network, cells of 53 bytes are formed, including data and overheads as recommended for an ATM cell. If the network discards cells occasionally due to congestion, or if there are errors in a cell, the video quality may suffer. While many techniques exist for masking errors, the method of the present invention allows correction of errors. The method is an improvement of the vertical/horizontal parity correction method which allows exact recovery of a missing packet. Data with loss rates of up to 1 in 50 cells have been recovered.

What is claimed:

1. A method of recovering lost or errored packets of data transported through an ATM network having a plurality of nodes, comprising the steps of:

segmenting data into blocks of predetermined size;

computing vertical and diagonal parity packets for the blocks;

adding the vertical and diagonal parity packets to the blocks;

transmitting the blocks with the vertical and diagonal parity packets from a first node to a second node of an ATM network;

selectively identifying errored or missing packets at a second node of an ATM network;

selectively recovering data for errored or missing packets in an ATM adaptation layer at a second node in an ATM network by computing the lost or missing data from the vertical and diagonal parity packets and from other information packets; and transmitting a corrected packet from a second node to a third node in an ATM network.

2. The method of claim 1 wherein the vertical and diagonal parity packets are formed in an ATM adaptation layer.

3. The method of claim 2 wherein the ATM adaptation layer selectively implements the step of recovering data.

4. The method of claim 1 wherein packet recovery capability is increased by the step of adding parity packets which are linearly independent of previously constructed parity packets.

5. The method of claim 1 wherein the step of computing vertical and diagonal parity packets for the blocks comprises modulo 2 additions.

6. The method of claim 5 wherein the step of computing the lost or missing data from the vertical and diagonal parity comprises modulo 2 additions.

7. A method of recovering lost or errored data transmitted through an ATM network having a plurality of nodes, comprising the steps of:

grouping data into blocks;

forming a vertical parity packet by modulo-2 addition of data along block verticals;

forming a diagonal parity packet by modulo-2 addition of data along block diagonals;

inserting the vertical and diagonal parity packets into an ATM cell;

transmitting the ATM cell from a first node to a second node through an ATM network;

identifying lost or erroneous information in an ATM cell at a second node in an ATM network;

selectively recovering the lost or erroneous information in an ATM cell in an ATM adaptation layer at a second node in an ATM network by computing the lost or erroneous information from the vertical and diagonal parity packets; and transmitting a corrected packet from a second node to a third node in an ATM network.

8. The method of claim 7 wherein the vertical and diagonal parity packets are formed in an ATM adaptation layer.

9. The method of claim 7 wherein the step of computing vertical and diagonal parity packets for the blocks comprises modulo 2 additions.

10. The method of claim 9 wherein the step of computing the lost or missing data from the vertical and diagonal parity comprises modulo 2 additions.

11. A method of recovering lost or errored packets of data transported through an ATM network having a plurality of nodes, comprising the steps of:

grouping data into blocks of predetermined size;

computing vertical and diagonal parity packets for the blocks;

adding the vertical and diagonal parity packets to the blocks;

transmitting the blocks from a first node to a second node of an ATM network;

identifying errored or missing packets within the blocks at a second node in an ATM network; and selectively recovering data for errored or missing packets in an ATM adaptation layer at a second node in an ATM network by computing the lost or missing data from the vertical and diagonal parity packets through modulo 2 addition;

wherein the detection of errored or missing packets is accomplished along the network itself and does not require that the blocks of data reach their respective destinations.

12. The method of claim 11 further comprising the step of transmitting a corrected packet from a second node to a third node in an ATM network.

13. The method of claim 12 wherein the vertical and diagonal parity packets are formed in an ATM adaptation layer.

* * * * *